United States Patent
Bae et al.

(10) Patent No.: US 8,238,186 B2
(45) Date of Patent: Aug. 7, 2012

(54) SEMICONDUCTOR MEMORY DEVICE AND METHOD FOR OPERATING THE SAME

(75) Inventors: Ji-Hyae Bae, Gyeonggi-do (KR); Sang-Sie Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 342 days.

(21) Appl. No.: 12/613,347

(22) Filed: Nov. 5, 2009

(65) Prior Publication Data
US 2010/0118635 A1 May 13, 2010

(30) Foreign Application Priority Data
Nov. 11, 2008 (KR) .................. 10-2008-0111483

(51) Int. Cl.
*G11C 7/00* (2006.01)
(52) U.S. Cl. .................. 365/219; 365/233.5
(58) Field of Classification Search .................. 365/219, 365/233.5
See application file for complete search history.

(56) References Cited

U.S. PATENT DOCUMENTS
| | | | | |
|---|---|---|---|---|
| 5,508,967 A | * | 4/1996 | Karino | 365/219 |
| 5,963,502 A | * | 10/1999 | Watanabe et al. | 365/233.1 |
| 6,370,162 B1 | * | 4/2002 | Takahashi et al. | 370/517 |

FOREIGN PATENT DOCUMENTS
KR 1020040092260 11/2004
KR 100632626 10/2006

OTHER PUBLICATIONS
Notice of Allowance issued from Korean Intellectual Property Office on May 23, 2011.

* cited by examiner

*Primary Examiner* — Michael Tran
(74) *Attorney, Agent, or Firm* — IP &T Group LLP (57) ABSTRACT

A semiconductor memory device is capable of performing a stable high-speed operation while inputting/outputting data. The semiconductor memory device includes an inversion output circuit configured to output a clocking pattern in a clocking mode, and an inversion pin to which the inversion output circuit is connected.

15 Claims, 5 Drawing Sheets

SEMICONDUCTOR MEMORY DEVICE AND METHOD FOR OPERATING THE SAME

CROSS-REFERENCE TO RELATED APPLICATIONS

The present application claims priority of Korean Patent Application No. 10-2008-0111483, filed on Nov. 11, 2008, which is incorporated herein by reference in its entirety.

BACKGROUND OF THE INVENTION

Exemplary embodiments of the present invention relate to a semiconductor memory device, and more particularly, to technology for stabilizing a high-speed operation of a semiconductor memory device by outputting a clocking pattern through an inversion pin.

There are several methods for stabilizing a high-speed operation in a semiconductor memory device. The methods include a method of monitoring a channel transmission error of read/write data like a cyclic redundancy check, and a method of checking the setup/hold of signals that are transmitted between a memory controller, e.g., a graphics processing unit (GPU) in case of a graphic memory device, and a memory device as in address/read/write training.

The methods further include a method of continuously transmitting information for a clock used in the memory device to the memory controller. In this method, if the memory device continuously transmits the information for the clock used therein to the memory controller, the memory controller can grasp the variation of temperature or voltage within the memory device immediately.

As the method of transmitting the clock information within the memory device, there is an EDC (Error Detection Code) hold pattern employed in a graphic memory device. This method is to repeatedly output a 4-bit hold pattern having the clock information to an EDC pin except in self-refresh/RDQS/reset/power-down modes and in the cases that CRC data are loaded on a bus and an internal WCK is unstable. If the hold pattern is constructed to be continuously toggled so as to produce an output pattern like 0101, the hold pattern outputted to the EDC pin has the information for the clock used in the memory device.

CRC (cyclic redundancy check) data are outputted to the EDC pin while read data are outputted from the memory device. Therefore, since the EDC hold pattern is not outputted while the read data are outputted, there is a concern that the clock information of the memory device may not be outputted to the outside of a chip. If the hold pattern is outputted through the EDC pin while the read data are outputted, it is possible to output the clock information of the memory device to the outside of the chip while the read data are outputted. However, in this case, the CRC data are not outputted and thus it is impossible to detect an error in the read data.

In accordance with the present invention, a data bus inversion (DBI) pin is used to overcome the above-discussed drawbacks. Hereinafter, a role and the constitution of the inversion pin DBI used in a memory device will be described.

Figure 1:
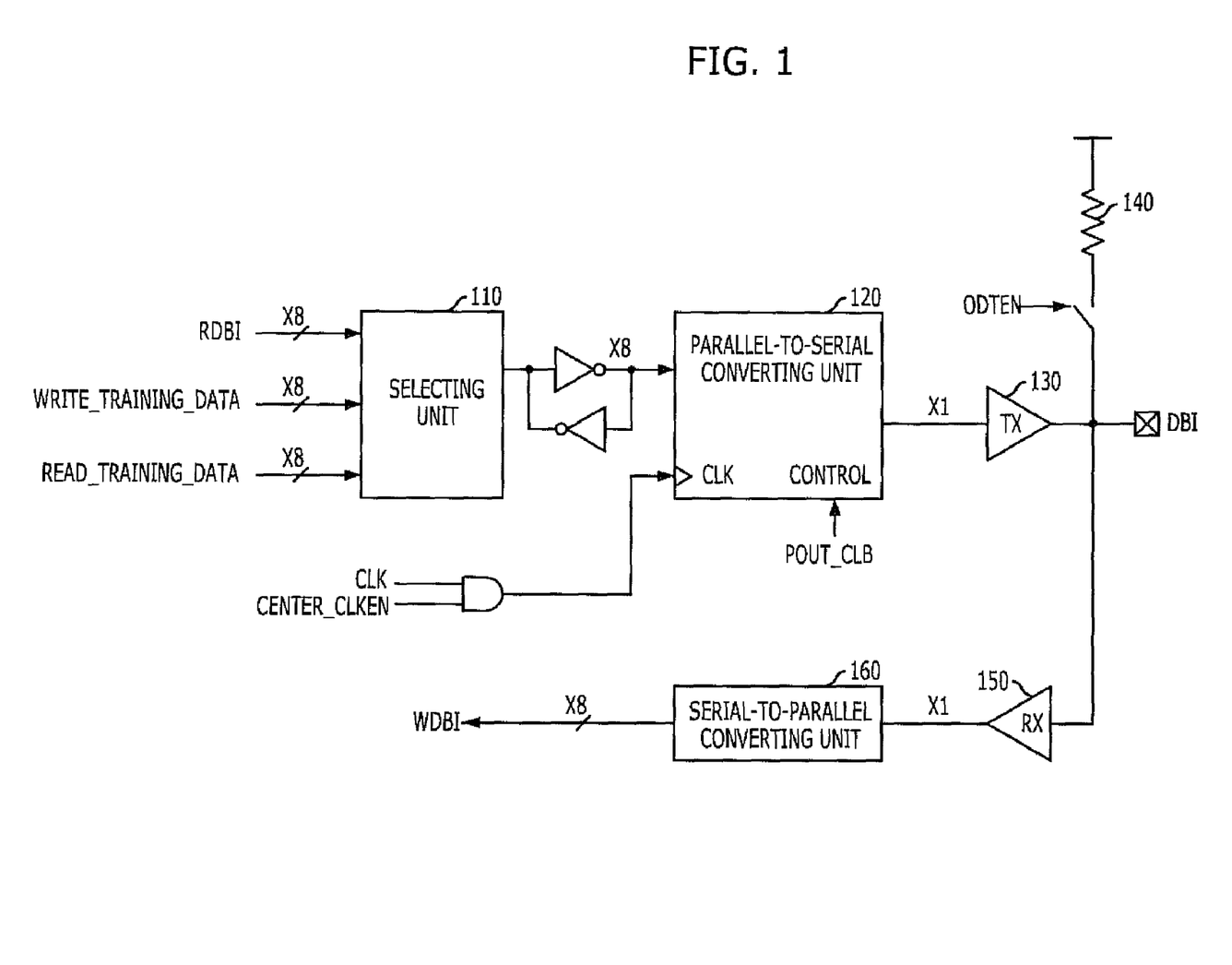
FIG. 1 is a block diagram illustrating a peripheral circuit of an inversion pin in a conventional memory device.

FIG. 1 is a block diagram illustrating a peripheral circuit of the inversion pin DBI in a conventional memory device.

The inversion pin DBI is employed to input/output inversion information that constitutes information about whether data inputted/outputted through a data pin DQ are inverted or not. In a write operation, inversion information WDBI is inputted to the memory device from the outside. In a read operation, inversion information RDBI is outputted from the memory device.

As described in FIG. 1, the peripheral circuit includes a selecting unit 110, a parallel-to-serial converting unit 120, an output driver 130, a termination resistor 140, an input buffer 150, and a serial-to-parallel converting unit 160.

The selecting unit 110 plays a role of determining the signal inputted to the parallel-to-serial converting unit 120 depending on conditions. That is, the selecting unit 110 selects the inversion information RDBI in the read operation and write training data WRITE_TRAINING_DATA in a write training operation. Moreover, in a read training operation, read training data READ_TRAINING_DATA are selected. For reference, the read training data READ_TRAINING_DATA are inputted from the outside of the chip together with a pattern loading instruction LDFF.

The parallel-to-serial converting unit 120, also referred to as a first-in-first-out (FIFO), serially arranges signals inputted thereto in parallel. Since FIG. 1 illustrates a memory device using 8-bit pre-patch, the parallel-to-serial converting unit 120 described in FIG. 1 arranges 8 parallel signals into series signals. The parallel-to-serial converting unit 120 operates in sync with a clock CLK. Therefore, since there is no need for the inversion pin DBI to input/output the inversion information while the data are not inputted/outputted through the data pin DQ, the clock CLK used for the parallel-to-serial converting unit 120 is generally designed to be only enabled while the data are inputted/outputted, i.e., in the read/write operation, thereby reducing current consumption. A signal CENTER_CLKEN in FIG. 1 is employed to control the clock CLK inputted to the parallel-to-serial converting unit 120 as described above. Thus, the clock CLK inputted to the parallel-to-serial converting unit 120 is toggled while the signal CENTER_CLKEN is enabled and not toggled while the signal CENTER_CLKEN is disabled. A signal POUT_CLB controls the inversion information RDBI to be outputted corresponding to the column address strobe (CAS) latency (CL) and thus determines the timing that data arranged by the parallel-to-serial converting unit 120 are transmitted to the output driver 130.

The output driver 130 plays a role of outputting a signal outputted from the parallel-to-serial converting unit 120 to the outside of the chip using the inversion pin DBI.

The termination resistor 140 is employed for the impedance matching of the inversion pin DBI. Since the output driver 130 outputting the inversion information can perform the impedance matching by itself, the termination resistor 140 is only turned on while the inversion information is inputted through the inversion pin DBI. A signal ODTEN in FIG. 1 is to turn on/off the termination resistor 140 and is enabled to turn on the termination resistor 140 when the inversion information is inputted from the outside.

The input buffer 150 receives the inversion information WDBI inputted through the inversion pin DBI and the serial-to-parallel converting unit 160 arranges the inversion information WDBI in parallel and transmits the arranged information to the inside of the memory device.

SUMMARY OF THE INVENTION

An embodiment of the present invention is directed to a semiconductor memory device capable of performing a stable high-speed operation while inputting/outputting data.

In accordance with an embodiment of the present invention, a semiconductor memory device includes an inversion output circuit configured to output a clocking pattern in a clocking mode, and an inversion pin to which the inversion output circuit is connected.

The inversion output circuit is configured to output inversion information when data are outputted from the semiconductor memory device, while outputting the clocking pattern in the clocking mode regardless of whether the data are being outputted during the clocking mode. The inversion output circuit includes a selecting unit configured to selectively output the inversion information inputted in parallel or the clocking pattern inputted in parallel to its output node, a parallel-to-serial converting unit configured to serially arrange an output signal of the selecting unit, and an output driver configured to output an output signal of the parallel-to-serial converting unit to the inversion pin.

The selecting unit is configured to output the inversion information in response to a read instruction and output the clocking pattern in response to a pattern load instruction, wherein the clocking pattern is outputted in the clocking mode regardless of the read instruction. The selecting unit includes first pass gates configured to transmit the inversion information by being turned on in response to the read instruction except when the semiconductor memory device is in the clocking mode, second pass gates configured to transmit write training data inputted in parallel by being turned on in a write training operation except when the semiconductor memory device is in the clocking mode, and third pass gates configured to transmit the clocking pattern by being turned on in response to a pattern load instruction.

The semiconductor memory device further includes a clock control unit configured to control a clock inputted to the parallel-to-serial converting unit to be enabled in the clocking mode, wherein the parallel-to-serial converting unit is configured to operate while being synchronized with the clock. In addition, the semiconductor memory device further includes a termination control unit configured to control a termination resistor connected to the inversion pin to be turned off in the clocking mode.

In accordance with another embodiment of the present invention, a semiconductor memory device includes a selecting unit configured to transmit inversion information inputted in parallel in a read operation, training data inputted in parallel in a training operation and a clocking pattern inputted in parallel in a clocking mode, a parallel-to-serial converting unit configured to serially convert a signal transmitted from the selecting unit, an output driver configured to output an output signal of the parallel-to-serial converting unit, and an inversion pin to which the output driver is connected.

The parallel-to-serial converting unit is configured to operate while being synchronized with a clock and output the serially converted signal in response to an output control signal. The semiconductor memory device further includes a clock control unit configured to control the clock inputted to the parallel-to-serial converting unit to be enabled in the clocking mode, an output control unit configured to control the output control signal to be enabled in the clocking mode, and a termination control unit configured to control a termination resistor connected to the inversion pin to be turned off in the clocking mode.

In accordance with yet another embodiment of the present invention, a method for operating a semiconductor memory device includes entering into a clocking mode, receiving a clocking pattern, and repeatedly outputting the clocking pattern through an inversion pin.

The clocking pattern is outputted through the inversion pin in the clocking mode even when data are inputted/outputted through a data pin.

The receiving of the clocking pattern includes receiving a pattern load instruction, receiving a pattern corresponding to the pattern load instruction, and storing the received pattern as the clocking pattern.

The outputting of the clocking pattern includes serially arranging the clocking pattern inputted in parallel, and outputting the serially arranged clocking pattern to the inversion pin.

The method for operating the semiconductor memory device further includes controlling a termination resistor connected to the inversion pin to be turned off when the semiconductor memory device enters into the clocking mode.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the prevent invention.

Figure 2:
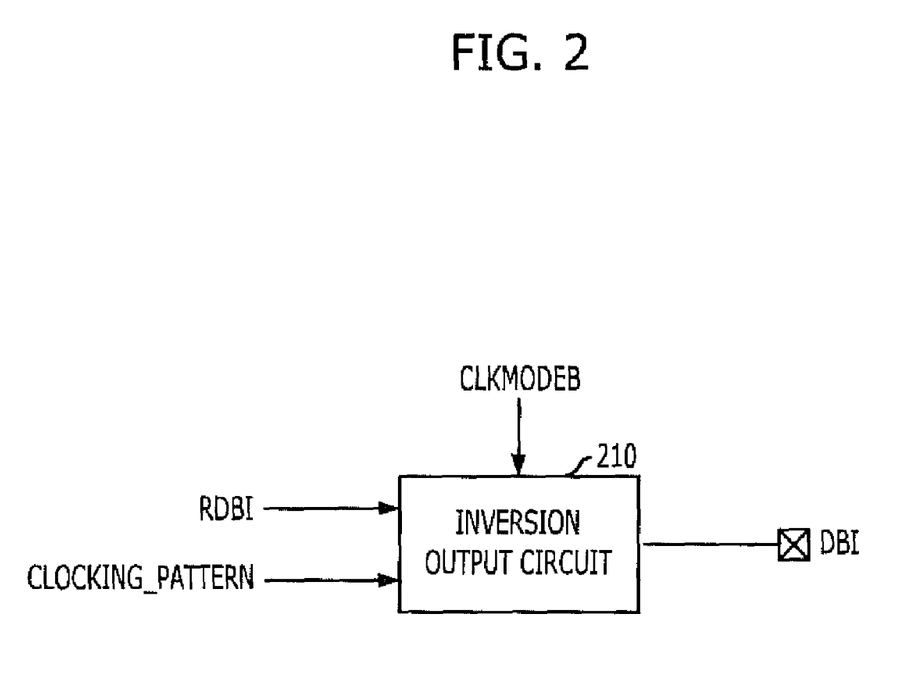
FIG. 2 is a block diagram illustrating a semiconductor memory device in accordance with an embodiment of the present invention.

FIG. 2 is a block diagram illustrating a semiconductor memory device in accordance with an embodiment of the present invention.

Referring to FIG. 2, the semiconductor memory device includes an inversion output circuit 210 for outputting a clocking pattern CLOCKING_PATTERN in a clocking mode, and an inversion pin DBI connected to the inversion output circuit 210.

The inversion output circuit 210 outputs inversion information RDBI when data are outputted. However, in the clocking mode, the inversion output circuit 210 outputs the clocking pattern CLOCKING_PATTERN even if the data are outputted.

The clocking mode according to an embodiment of the present invention is a mode of repeatedly outputting the clocking pattern CLOCKING_PATTERN through the inversion pin DBI. If the semiconductor memory device enters into the clocking mode, the inversion information RDBI and WDBI is not inputted/outputted through the inversion pin DBI when the data are inputted/outputted and only the clocking pattern CLOCKING_PATTERN is continuously outputted. A docking mode signal CLKMODEB is a signal enabled when entering into the clocking mode and the entry into the clocking mode may be achieved by the MRS setting and so forth. By setting an appropriate rule between a memory controller and the semiconductor memory device, cases where a clocking mode is entered can be determined.

As described in the background of the invention, the inversion output circuit 210 may be designed to output write training data in a write training operation and to output read training data in a read training operation in addition to outputting the inversion information RDBI. This, i.e., the outputting of the read/write training data through the inversion pin DBI, may be changed depending on different design schemes as to how to use the inversion pin DBI in the training operation. Regardless of how the inversion pin DBI is used in different design schemes, the clocking pattern CLOCKING_PATTERN can be outputted through the inversion pin DBI in the clocking mode according to an embodiment of the present invention.

For instance, in cases where a semiconductor memory device outputs training data through the inversion pin DBI, the inversion information RDBI or the training data is outputted through the inversion pin DBI depending on the conditions when the semiconductor memory device is not in the clocking mode, and only the clocking pattern CLOCKING_PATTERN is repeatedly outputted through the inversion pin DBI when the semiconductor memory device enters into the clocking mode. Meanwhile, in cases where a semiconductor memory device does not output the training data through the inversion pin DBI, the inversion information RDBI is outputted through the inversion pin DBI when the semiconductor memory device is not in the clocking mode and only the clocking pattern CLOCKING_PATTERN is repeatedly outputted through the inversion pin DBI when the semiconductor memory device enters into the clocking mode.

Figure 3:
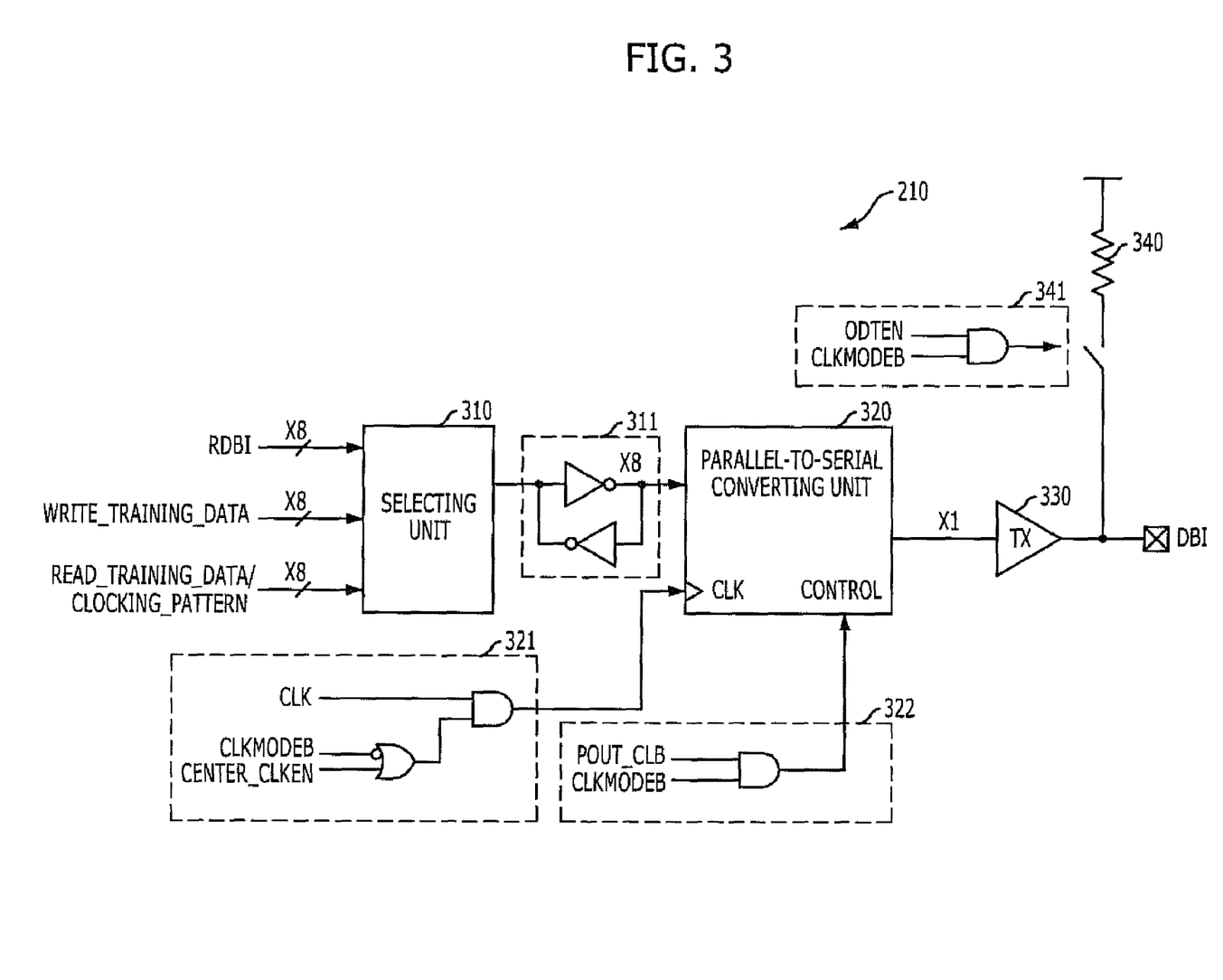
FIG. 3 is a schematic circuit diagram illustrating an inversion output circuit shown in FIG. 2.

FIG. 3 is a schematic circuit diagram illustrating the inversion output circuit 210 shown in FIG. 2.

Referring to FIG. 3, the inversion output circuit 210 includes a selecting unit 310, a parallel-to-serial converting unit 320, a clock control unit 321, and an output control unit 322. The selecting unit 310 transmits the inversion information RDBI inputted thereto in parallel in the read operation, training data TRAINING_DATA inputted thereto in parallel in the training operation, and the clocking pattern CLOCKING_PATTERN inputted thereto in parallel in the clocking mode.

The parallel-to-serial converting unit 320 serially converts a signal transmitted from the selecting unit 310. The inversion output circuit 210 further includes output driver 330 for outputting an output signal of the parallel-to-serial converting unit 320 to the inversion pin DBI.

When the semiconductor memory device is not in the clocking mode, the selecting unit 310 outputs the inversion information RDBI in a data outputting operation, i.e., the read operation, and the write training data WRITE_TRAINING_DATA in the write training operation. In the read training operation, the selecting unit 310 outputs the read training data READ_TRAINING_DATA. That is, when the semiconductor memory device is not in the clocking mode, the selecting unit 310 may operate in the same manner as the selecting unit 110 does. However, in the clocking mode, the selecting unit 310 repeatedly outputs the clocking pattern CLOCKING_PATTERN only. A latch 311 connected to an output of the selecting unit 310 may be employed to maintain a previous value if a new signal is not outputted from the selecting unit 310.

The clocking pattern CLOCKING_PATTERN may be received in the same manner as a read training pattern is received. That is, in the read training operation, the read training pattern is received using a pattern load instruction LDFF and the received read training pattern is outputted.

Even in the clocking mode, the clocking pattern CLOCKING_PATTERN may be received using the pattern load instruction LDFF and the received clocking pattern CLOCKING_PATTERN may be outputted. This will be described in detail hereinafter with reference to relating drawings.

The parallel-to-serial converting unit 320 converts a parallel signal outputted from the selecting unit 310, i.e., the inversion information, the training data or the clocking pattern, to a serial signal. For instance, FIG. 3 illustrates the case where the semiconductor memory device uses 8-bit pre-patch and thus 8 parallel signals are arranged in series. The parallel-to-serial converting unit 320 operates while being synchronized with a clock CLK. In FIG. 1, the clock inputted to the conventional parallel-to-serial converting unit 120 is toggled while the signal CENTER_CLKEN is enabled and not toggled while the signal CENTER_CLKEN is disabled. However, in accordance with an embodiment of the present invention, the parallel-to-serial converting unit 320 operates even in the clocking mode and repeatedly output a clocking pattern that is serially converted. Therefore, the clock CLK inputted to the parallel-to-serial converting unit 320 is always enabled in the clocking mode.

The clock control unit 321 is employed to control the clock CLK inputted to the parallel-to-serial converting unit 320. The clock CLK inputted to the parallel-to-serial converting unit 320 is controlled to be enabled/disabled depending on a signal CENTER_CLKEN when the semiconductor memory device is not in the clocking mode, i.e., the clocking mode signal CLKMODEB has a logic high level. By contrast, when the semiconductor memory device in the clocking mode, i.e., the clocking mode signal CLKMODEB has a logic low level, the clock CLK inputted to the parallel-to-serial converting unit 320 is enabled regardless of a logic level of the signal CENTER_CLKEN.

As described in the background of the invention, an output control signal POUT_CLB controls the inversion information RDBI to be outputted corresponding to the CAS (column addressstrobe) latency (CL) and determines the timing of the signal outputted from the parallel-to-serial converting unit 320. That is, when the output control signal POUTB_CLB is enabled to a logic low level, a signal arranged in series is outputted from the parallel-to-serial converting unit 320. Since the clocking pattern CLOCKING_PATTERN should be repeatedly outputted in the clocking mode, the output control unit 322 controls such an operation. The control unit 322 outputs a control signal CONTROL that always has a logic low level in the clocking mode. That is, the control signal CONTROL inputted to the parallel-to-serial converting unit 320 always has the logic low level when the clocking mode signal CLKMODEB has the logic low level under the control of the output control unit 322.

The output driver 330 outputs the signal converted in series by the parallel-to-serial converting unit 320 to the inversion pin DBI.

A termination resistor 340 is employed to perform impedance matching between the inversion pin DBI and an external channel when the inversion information WDBI is inputted through the inversion pin DBI. Since the impedance matching is achieved by operations of the output driver 330 when the inversion information RDBI is outputted through the inversion pin DBI, the termination resistor 340 is turned on only when the inversion information WDBI is inputted through the inversion pin DBI. A signal ODTEN described in FIG. 3 is a signal that turns on/off the termination resistor 340 and is enabled in the write operation where the data and the inversion information WDBI are inputted from the outside of the chip. In accordance with an embodiment of the present invention, the clocking pattern CLOCKING_PATTERN has to be always outputted through the inversion pin DBI in the clocking mode. Therefore, the termination resistor 340 should be turned off in the clocking mode regardless of whether the read or write operation is being performed. The inversion output circuit 210 further includes a termination control unit 341 to control the turn-on/off of the termination resistor 340. That is, the termination control unit 341 transmits the signal ODTEN, but prevents its output from being enabled to a logic high level in the clocking mode, i.e., when the clocking mode signal CLKMODEB has a logic low level, thereby controlling the termination resistor 340 to maintain its turn-off state.

Figure 4:
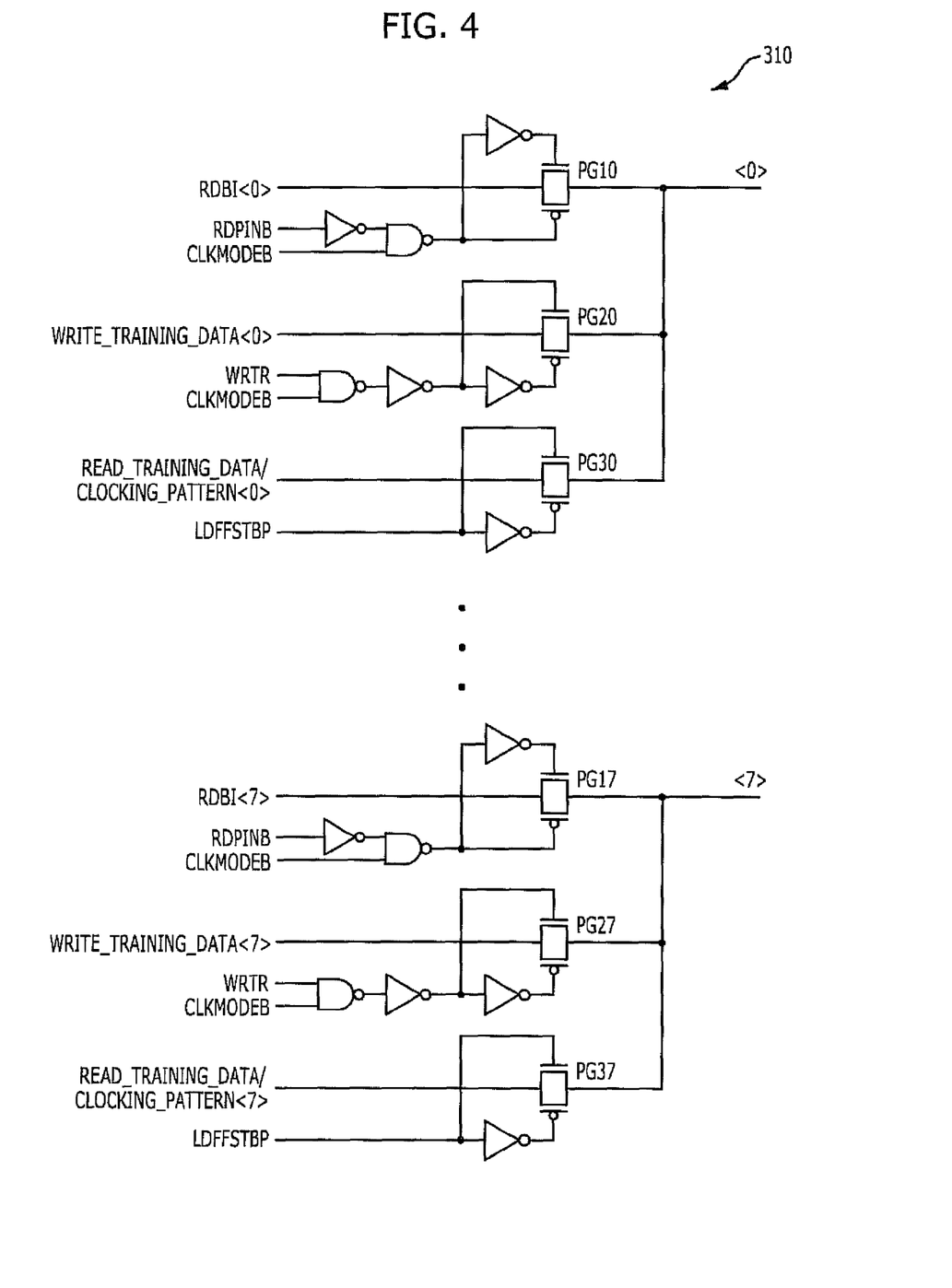
FIG. 4 is a schematic circuit diagram illustrating a selecting unit shown in FIG. 3.

FIG. 4 is a schematic circuit diagram illustrating the selecting unit 310 shown in FIG. 3.

Referring to FIG. 4, the selecting unit 310 includes a plurality of pass gates. First pass gates PG10 to PG17 are turned on in response to a read instruction, e.g., a signal RDPINB, when the semiconductor memory device is not in the clocking mode, i.e., the clocking mode signal CLKMODEB has the logic high level, thereby transmitting inversion information RDBI<0:7> inputted thereto in parallel. Second pass gates PG20 to PG27 are turned on in the write training operation when the semiconductor memory device is not in the clocking mode, i.e., the clocking mode signal CLKMODEB has the logic high level, thereby transmitting write training data WRITE_TRAINING_DATA<0:7> inputted thereto in parallel. Third pass gates PG30 to PG37 are turned on in response to a pattern load instruction LDFFSTBP to thereby transmit a clocking pattern CLOCKING_PATTERN<0:7> inputted thereto in parallel.

Hereinafter, an operation of the selecting unit 310 will be classified into a case that the semiconductor memory device is in the clocking mode and a case that the semiconductor memory device is not in the clocking mode and the cases will be described.

First of all, the operation of the selecting unit 310 in the case where the semiconductor memory device is not in the clocking mode will be described. When the semiconductor memory device is not in the clocking mode, the clock mode signal CLKMODEB is disabled to the logic high level. At this time, the first pass gates PG10 to PG17 are turned on whenever the read instruction is inputted, thereby transmitting the inversion information RDBI<0:7> to the parallel-to-serial converting unit 320. The signal RDPINB described in FIG. 4 is enabled to a logic low level whenever the read instruction is enabled. The second pass gates PG20 to PG27 are turned on in the write training operation to transmit the write training data WRITE_TRAINING_DATA<0:7> to the parallel-to-serial converting unit 320. A signal WRTR described in FIG. 4 is enabled to a logic high level in the write training operation. The third pass gates PG30 to PG37 are turned on in response to the pattern load instruction LDFF, thereby transmitting the read training data READ_TRAINING_DATA<0:7> to the parallel-to-serial converting unit 320. The signal LDFFSTBP described in FIG. 4 corresponds to a pulse signal that is enabled to a logic high level when the pattern load instruction LDFF is inputted.

Referring to the clocking mode operation, the clock mode signal CLKMODEB is enabled to the logic low level in the clocking mode. At this time, the first pass gates PG10 to PG17 and the second pass gates PG20 to PG27 are always turned off regardless of logic levels of the signals RDPINB and WRTR. The third pass gates PG30 to PG37 receive the clocking pattern CLOCKING_PATTERN<0:7> in response to the pattern load instruction LDFF. The pattern load instruction LDFF is to input the read training data READ_TRAINING_DATA<0:7> to the parallel-to-serial converting unit 320 in the read training operation, and is also used to input the clocking pattern CLOCKING_PATTERN<0:7> to the parallel-to-serial converting unit 320 in the clocking mode in accordance with an embodiment of the present invention. That is, the third pass gates PG30 to PG37 receive the clocking pattern CLOCKING_PATTERN<0:7> in the clocking mode in the same manner that they receive the read training data READ_TRAINING_DATA<0:7> when the semiconductor memory device is not in the clocking mode.

When inputting the clocking pattern CLOCKING_PATTERN<0:7> in response to the pattern load instruction LDFF and thus in response to LDFFSTBP, since the inputted value is continuously maintained by the latch 311 disposed at the output of the selecting unit 310, the same pattern may be continuously outputted to the outside of the chip through the output driver 330. In the case of using a signal being continuously toggled for producing the clocking pattern, the clocking pattern CLOCKING PATTERN<0:7> of (0, 1, 0, 1, 0, 1, 0, 1) is inputted. In the case of using a signal that repeats itself in every 4 bits such as (1001), the clocking pattern CLOCKING_PATTERN<0:7> of (1, 0, 0, 1, 1, 0, 0, 1) is inputted.

Figure 5:
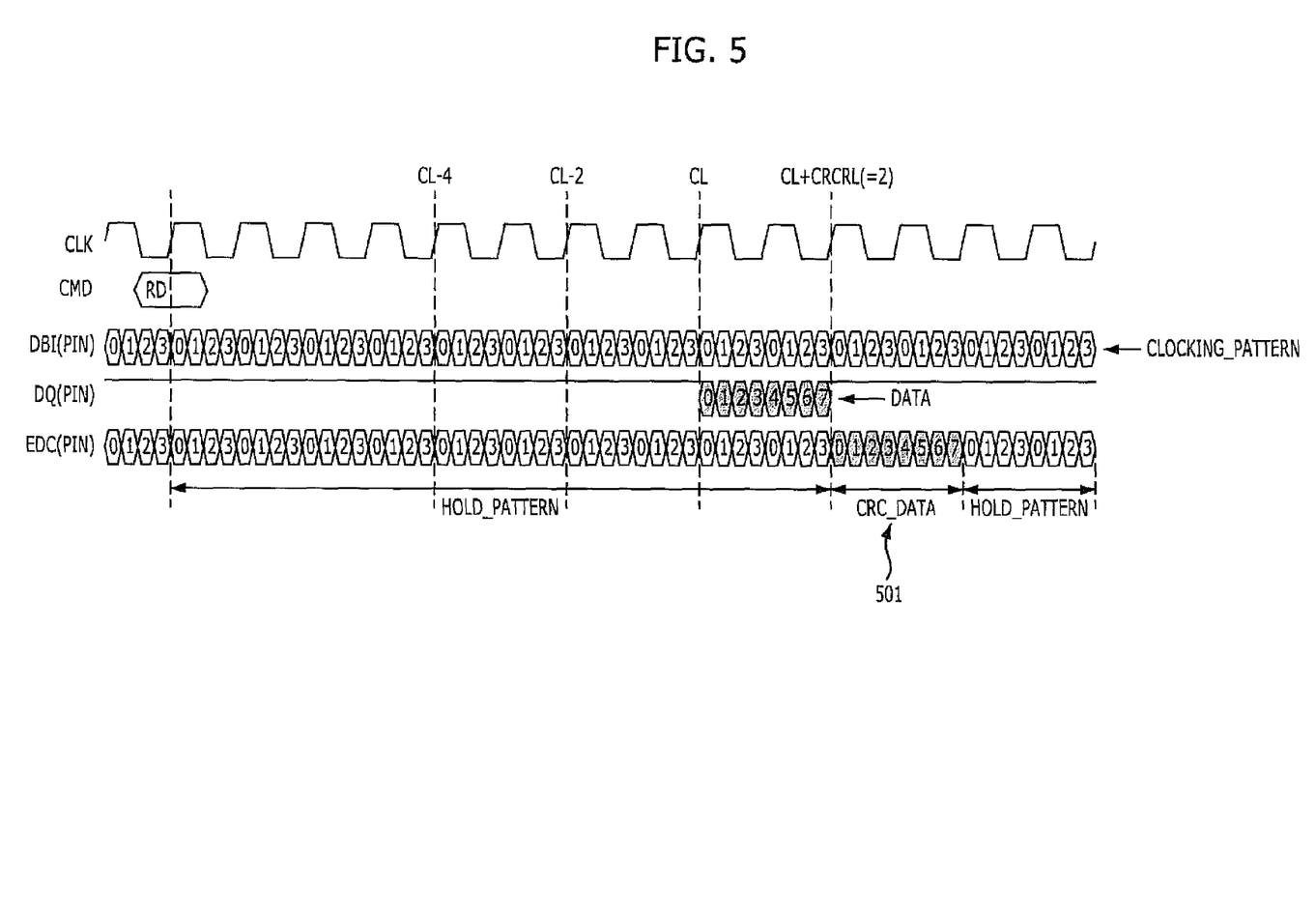
FIG. 5 is a signal timing diagram explaining a clocking mode operation of the semiconductor memory device in accordance with an embodiment of the present invention.

FIG. 5 is a signal timing diagram illustrating the clocking mode operation of the semiconductor memory device in accordance with an embodiment of the present invention.

Referring to FIG. 5, since the semiconductor memory device is in the clocking mode, the repeating clocking pattern is continuously outputted through the inversion pin DBI. FIG. 5 shows the case where a bit pattern (0, 1, 2, and 3) is repeatedly outputted and thus a repeating 4-bit clocking pattern is outputted.

Through a data pin DQ, data DATA are outputted from a point where the CL is passed after a read instruction RD is inputted. FIG. 5 shows a case where a data pattern (0, 1, 2, 3, 4, 5, 6 and 7) is outputted and thus 8 bits of data are outputted through the data pin DQ in response to the read instruction RD.

Through an EDC pin, a hold pattern HOLD_PATTERN is normally outputted. In FIG. 5, a bit pattern (0, 1, 2 and 3) is repeatedly outputted through the EDC pin, and thus a 4-bit repeating hold pattern is outputted. After the data are outputted and then the latency CRCRL for the CRC data is passed, the CRC data CRC_DATA are outputted through the EDC pin, referring to a period 501 in FIG. 5. Data pattern (0, 1, 2, 3, 4, 5, 6 and 7) outputted in the period 501 are CRC data CRC_DATA corresponding to data outputted through a data pin just before.

In the conventional semiconductor memory device, there is no method for the memory controller to obtain information for the clock used in the memory device during the period 501 since the hold pattern is not outputted through the EDC pin during the period 501. However, in the semiconductor memory device in accordance with an embodiment of the present invention, the clocking pattern is always outputted through the inversion pin DBI in the clocking mode. Therefore, the memory controller can monitor a condition for the clock in the memory device even during the period 501.

Although, in FIG. 5, the period 501 is illustrated as a short period, it corresponds to a relatively long period among operations of the memory device in the case where the read operation is continuously performed. Therefore, the existence of the pin always outputting the clocking pattern in the specific mode including the period 501 may significantly increase the stability of the high-speed operation of the memory device.

Referring back to FIGS. 2 to 5, an operation of the semiconductor memory device in accordance with an embodiment of the present invention will be described hereinafter.

The operation of the semiconductor memory device in accordance with an embodiment of the present invention may be performed by entering into a clocking mode, receiving a clocking pattern CLOCKING_PATTERN, and repeatedly outputting the clocking pattern CLOCKING_PATTERN through an inversion pin (data bus inversion) DBI.

As described above, in the clocking mode, the clocking pattern CLOCKING_PATTERN is continuously outputted through the inversion pin DBI even if data are inputted/outputted through the data pin DQ.

Receiving the clocking pattern CLOCKING PATTERN may be performed in the same manner of receiving the read training data READ_TRAINING_DATA. In particular, the clocking pattern receiving step may be performed by receiving the load instruction LDFF, receiving the pattern CLOCKING_PATTERN<0:7> corresponding to the pattern load instruction LDFF, and latching the received pattern as the clocking pattern CLOCKING_PATTERN for being stored.

Furthermore, the above outputting step may include serially arranging the clocking pattern CLOCKING_PATTERN inputted in parallel by using the parallel-to-serial converting unit 320, and outputting the serially arranged clocking pattern to the inversion pin DBI by using the output driver 330.

The method of operating the semiconductor memory device may further include controlling the termination resistor 340 to be turned off upon entering into the clocking mode, wherein the termination resistor 340 is connected to the inversion pin DBI.

In the semiconductor memory device in accordance with an embodiment of the present invention, the clocking pattern is outputted through the inversion pin if the semiconductor memory device enters into the clocking mode. Therefore, the information for the clock within the semiconductor memory device may be transmitted to the memory controller even when the data are being inputted/outputted, and thus, it is possible to secure the stability of the operation of the semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
an inversion output circuit configured to output inversion information indicating whether data outputted from the memory device are inverted or not in a read operation and output a clocking pattern in a clocking mode; and
an inversion pin to which the inversion output circuit is connected.

2. The semiconductor memory device of claim 1, wherein the clocking mode has the priority to the read operation.

3. A semiconductor memory device, comprising:
an inversion output circuit configured to output a clocking pattern in a clocking mode; and
an inversion pin to which the inversion circuit is connected,
wherein the inversion output circuit is configured to output inversion information when data are outputted from the semiconductor memory device, while outputting the clocking pattern in the clocking mode regardless of whether the data are being outputted during the clocking mode, and
wherein the inversion output circuit comprises:
a selecting unit configured to selectively output the inversion information inputted in parallel or the clocking pattern inputted in parallel to its output node;
a parallel-to-serial converting unit configured to serially arrange an output signal of the selecting unit; and
an output driver configured to output an output signal of the parallel-to-serial converting unit to the inversion pin.

4. The semiconductor memory device of claim 3, wherein the selecting unit is configured to output the inversion information in response to a read instruction and output the clocking pattern in response to a pattern load instruction, wherein the clocking pattern is outputted in the clocking mode regardless of the read instruction.

5. The semiconductor memory device of claim 3, wherein the selecting unit includes:
first pass gates configured to transmit the inversion information by being turned on in response to the read instruction except when the semiconductor memory device is in the clocking mode;
second pass gates configured to transmit write training data inputted in parallel by being turned on in a write training operation except when the semiconductor memory device is in the clocking mode; and
third pass gates configured to transmit the docking pattern by being turned on in response to a pattern load instruction.

6. The semiconductor memory device of claim 5, wherein a latching unit is provided at the output node of the selecting unit to latch signals transmitted from the first to third pass gates.

7. The semiconductor memory device of claim 3, further comprising a clock control unit configured to control a clock inputted to the parallel-to-serial converting unit to be enabled in the clocking mode, wherein the parallel-to-serial converting unit is configured to operate while being synchronized with the clock.

8. The semiconductor memory device of claim 3, further comprising a termination control unit configured to control a termination resistor connected to the inversion pin to be turned off in the clocking mode.

9. A semiconductor memory device, comprising:
a selecting unit configured to transmit inversion information inputted in parallel in a read operation, training data inputted in parallel in a training operation and a clocking pattern inputted in parallel in a clocking mode, wherein the inversion information indicates whether data outputted from the memory device are inverted or not;
a parallel-to-serial converting unit configured to serially convert a signal transmitted from the selecting unit;
an output driver configured to output an output signal of the parallel-to-serial converting unit; and
an inversion pin to which the output driver is connected.

10. The semiconductor memory device of claim 9, wherein the parallel-to-serial converting unit is configured to operate while being synchronized with a clock and output the serially converted signal in response to an output control signal.

11. The semiconductor memory device of claim 10, further comprising:
a clock control unit configured to control the clock inputted to the parallel-to-serial converting unit to be enabled in the clocking mode;
an output control unit configured to control the output control signal to be enabled in the clocking mode; and
a termination control unit configured to control a termination resistor connected to the inversion pin to be turned off in the clocking mode.

12. A method for operating a semiconductor memory device, the method comprising:
entering into a clocking mode;
receiving a clocking pattern; and repeatedly outputting the clocking pattern through an inversion pin,
wherein the receiving of the clocking pattern includes:
receiving a pattern load instruction;
receiving a pattern corresponding to the pattern load instruction; and
storing the received pattern as the clocking pattern.

13. The method of claim 12, wherein the clocking pattern is outputted through the inversion pin in the clocking mode even when data are inputted/outputted through a data pin.

14. The method of claim 12, wherein the outputting of the clocking pattern includes:
serially arranging the clocking pattern inputted in parallel; and
outputting the serially arranged clocking pattern to the inversion pin.

15. A method for operating a semiconductor memory device, the method comprising:
entering into a clocking mode;
receiving a clocking pattern;
repeatedly outputting the clocking pattern through an inversion pin; and
controlling a termination resistor connected to the inversion pin to be turned off when the semiconductor memory device enters into the clocking mode.

* * * * *